(12) United States Patent
Wu et al.

(10) Patent No.: US 10,515,919 B2
(45) Date of Patent: *Dec. 24, 2019

(54) BUMP-ON-TRACE DESIGN FOR ENLARGE BUMP-TO-TRACE DISTANCE

(71) Applicant: Taiwan Semiconductor Manufacturing Company, Ltd., Hsin-Chu (TW)

(72) Inventors: Sheng-Yu Wu, Hsin-Chu (TW); Tin-Hao Kuo, Hsin-Chu (TW); Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 378 days.

This patent is subject to a terminal disclaimer.

(21) Appl. No.: 14/990,515

(22) Filed: Jan. 7, 2016

(65) Prior Publication Data
US 2016/0118360 A1 Apr. 28, 2016

Related U.S. Application Data

(63) Continuation of application No. 14/072,896, filed on Nov. 6, 2013, now Pat. No. 9,269,688.

(51) Int. Cl.
*H01L 23/488* (2006.01)
*H01L 23/00* (2006.01)
(Continued)

(52) U.S. Cl.
CPC ........ *H01L 24/17* (2013.01); *H01L 23/49816* (2013.01); *H01L 23/49827* (2013.01);
(Continued)

(58) Field of Classification Search
CPC . H01L 23/49503; H01L 23/498; H01L 24/17; H01L 24/02–09; H01L 2224/0401
See application file for complete search history.

(56) References Cited

U.S. PATENT DOCUMENTS 8,574,959 B2   11/2013   Pendse
8,853,853 B2   10/2014   Chang et al.
(Continued)

FOREIGN PATENT DOCUMENTS

CN   102487020 A   6/2012
CN   102903689 A   1/2013
(Continued)

*Primary Examiner* — Daniel Whalen
*Assistant Examiner* — Suberr L Chi
(74) *Attorney, Agent, or Firm* — Slater Matsil, LLP

(57) ABSTRACT

A package includes a first and a second package component. The first package component includes a first metal trace and a second metal trace at the surface of the first package component. The second metal trace is parallel to the first metal trace. The second metal trace includes a narrow metal trace portion having a first width, and a wide metal trace portion having a second width greater than the first width connected to the narrow metal trace portion. The second package component is over the first package component. The second package component includes a metal bump overlapping a portion of the first metal trace, and a conductive connection bonding the metal bump to the first metal trace. The conductive connection contacts a top surface and sidewalls of the first metal trace. The metal bump is neighboring the narrow metal trace portion.

20 Claims, 5 Drawing Sheets

(51) Int. Cl.

| | | |
|---|---|---|
| *H01L 23/498* | (2006.01) | |
| *H05K 1/11* | (2006.01) | |
| *H01L 25/10* | (2006.01) | |
| *H01L 29/66* | (2006.01) | |
| *H01L 25/065* | (2006.01) | |
| *H01L 23/528* | (2006.01) | |
| *H01L 23/31* | (2006.01) | |

(52) U.S. Cl.
CPC .. *H01L 23/49838* (2013.01); *H01L 23/49894* (2013.01); *H01L 23/528* (2013.01); *H01L 24/02* (2013.01); *H01L 24/09* (2013.01); *H01L 24/14* (2013.01); *H01L 24/16* (2013.01); *H01L 24/33* (2013.01); *H01L 24/81* (2013.01); *H01L 25/0657* (2013.01); *H01L 25/105* (2013.01); *H01L 29/66* (2013.01); *H05K 1/111* (2013.01); *H01L 23/3192* (2013.01); *H01L 24/05* (2013.01); *H01L 24/13* (2013.01); *H01L 2224/0235* (2013.01); *H01L 2224/02375* (2013.01); *H01L 2224/0401* (2013.01); *H01L 2224/05073* (2013.01); *H01L 2224/05166* (2013.01); *H01L 2224/05548* (2013.01); *H01L 2224/05572* (2013.01); *H01L 2224/05647* (2013.01); *H01L 2224/1308* (2013.01); *H01L 2224/13022* (2013.01); *H01L 2224/13082* (2013.01); *H01L 2224/13111* (2013.01); *H01L 2224/13144* (2013.01); *H01L 2224/13147* (2013.01); *H01L 2224/13155* (2013.01); *H01L 2224/13164* (2013.01); *H01L 2224/14133* (2013.01); *H01L 2224/16013* (2013.01); *H01L 2224/16145* (2013.01); *H01L 2224/16148* (2013.01); *H01L 2224/16227* (2013.01); *H01L 2224/16238* (2013.01); *H01L 2224/3003* (2013.01); *H01L 2224/81191* (2013.01); *H01L 2224/81192* (2013.01); *H01L 2224/81385* (2013.01); *H01L 2224/81815* (2013.01); *H01L 2225/06513* (2013.01); *H01L 2225/1047* (2013.01); *H01L 2225/1058* (2013.01); *H01L 2924/3512* (2013.01); *H01L 2924/35121* (2013.01); *H01L 2924/3841* (2013.01); *H05K 2201/09727* (2013.01); *H05K 2201/10674* (2013.01); *Y02P 70/611* (2015.11)

(56) References Cited

U.S. PATENT DOCUMENTS

| | | |
|---|---|---|
| 9,257,385 B2 | 2/2016 | Chang et al. |
| 9,269,688 B2 * | 2/2016 | Wu .................. H01L 23/49816 |
| 2010/0193944 A1 * | 8/2010 | Castro .................. H01L 24/16 |
| | | 257/737 |
| 2011/0133334 A1 | 6/2011 | Pendse |
| 2011/0248399 A1 | 10/2011 | Pendse |
| 2012/0098120 A1 | 4/2012 | Yu et al. |
| 2012/0161330 A1 | 6/2012 | Hlad et al. |
| 2013/0001769 A1 | 1/2013 | Hou et al. |
| 2013/0026614 A1 | 1/2013 | Yu et al. |
| 2013/0099370 A1 | 4/2013 | Cheng et al. |
| 2013/0147030 A1 | 6/2013 | Chang et al. |
| 2013/0341806 A1 * | 12/2013 | Lin .................. H01L 24/16 |
| | | 257/778 |
| 2014/0110847 A1 | 4/2014 | Tseng et al. |

FOREIGN PATENT DOCUMENTS

| | | |
|---|---|---|
| CN | 103066043 A | 4/2013 |
| CN | 103151324 A | 6/2013 |

* cited by examiner

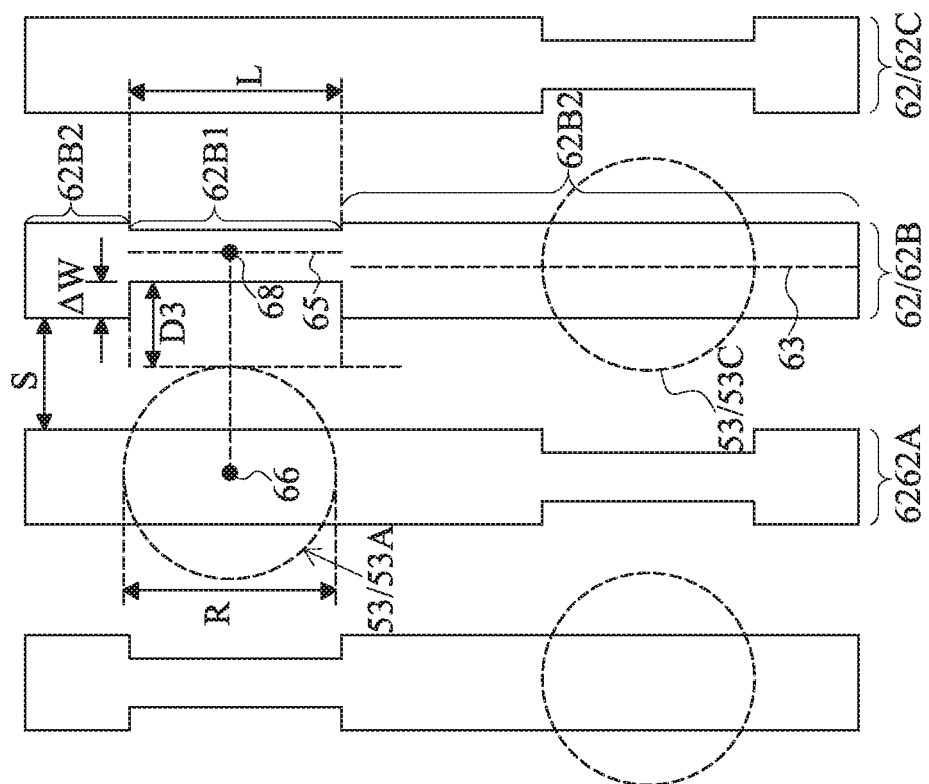

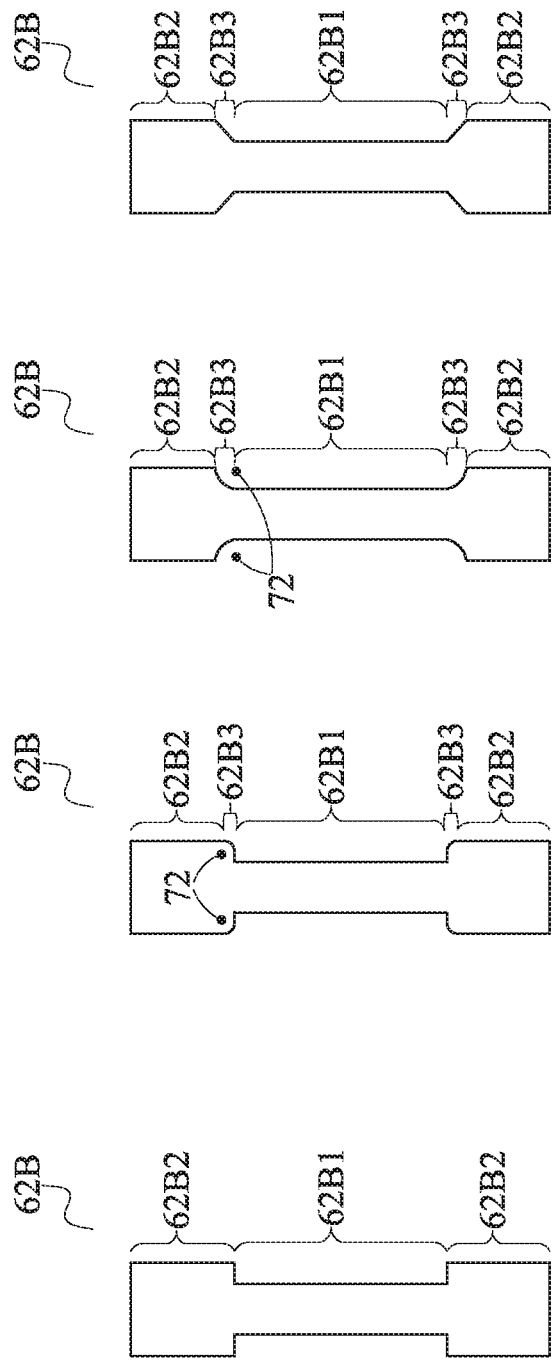

BUMP-ON-TRACE DESIGN FOR ENLARGE BUMP-TO-TRACE DISTANCE

PRIORITY CLAIM AND CROSS-REFERENCE

This application is a continuation of U.S. patent application Ser. No. 14/072,896, entitled "Bump-on-Trace Design for Enlarge Bump-to-Trace Distance," filed on Nov. 6, 2013, which application is incorporated herein by reference.

BACKGROUND

Bump-on-Trace (BOT) structures are used in flip chip packages, wherein metal bumps are bonded onto narrow metal traces in package substrates directly, rather than bonded onto metal pads that have greater widths than the respective connecting metal traces. The BOT structures require smaller chip areas, and the manufacturing cost of the BOT structures is low. The conventional BOT structures may achieve the same reliability as the conventional bond structures that are based on metal pads. In a typical BOT structure, a solder region is formed on a surface of a copper bump of a device die. The solder region bonds the copper bump to a metal trace in a package substrate. The solder region contacts a top surface and sidewalls of the metal trace, hence forming the BOT structure.

Since the existing BOT structures have very small spacings, neighboring BOT structures may be bridged to each other, wherein the solder region of one BOT bond structure is bridged to a neighboring metal trace. Particularly, the BOT structures in the peripheral areas of the packages are more likely to bridge due to the high density of the BOT structures in the peripheral areas. In addition, in the peripheral areas, the distance of the BOT structures are farther away from the centers of the respective packages. Accordingly, during the reflow process for forming the BOT structures, the shift of the BOT structures caused by the thermal expansion of the metal traces is more significant than in the areas close to the centers of the respective packages. Accordingly, the bridging is more likely to occur.

Previously, to reduce the likelihood of the bridging in BOT structures, either narrow metal traces are used, or less solder is used. When the metal traces are narrowed to reduce the bridging, since the adhesion of the metal traces to the respective underlying dielectric layer is related to the contacting area between the metal traces and the dielectric layer, with the reduction in the metal traces, the contacting area is reduced, the adhesion between the metal traces and the dielectric layer degrades. As a result, metal traces are more likely to peel off from the dielectric layer. On the other hand, if less solder is used to reduce the bridging, the stress that occur to the solder region is applied on a small solder region, solder crack is more likely to occur than on a larger solder region.

BRIEF DESCRIPTION OF THE DRAWINGS

For a more complete understanding of the embodiments, and the advantages thereof, reference is now made to the following descriptions taken in conjunction with the accompanying drawings, in which:

FIG. 4 illustrates a top view of metal bumps and metal traces in accordance with some exemplary embodiments, wherein a center line of a narrow metal trace portion of a metal trace offsets from a center line of wider portions of the metal trace; and FIGS. 5A through 5D illustrate the top views of various metal traces in accordance with some exemplary embodiments.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A Bump-on-Trace (BOT) bonding structure is provided in accordance with various exemplary embodiments. The variations of the embodiments are discussed. Throughout the various views and illustrative embodiments, like reference numbers are used to designate like elements.

Figure 1:
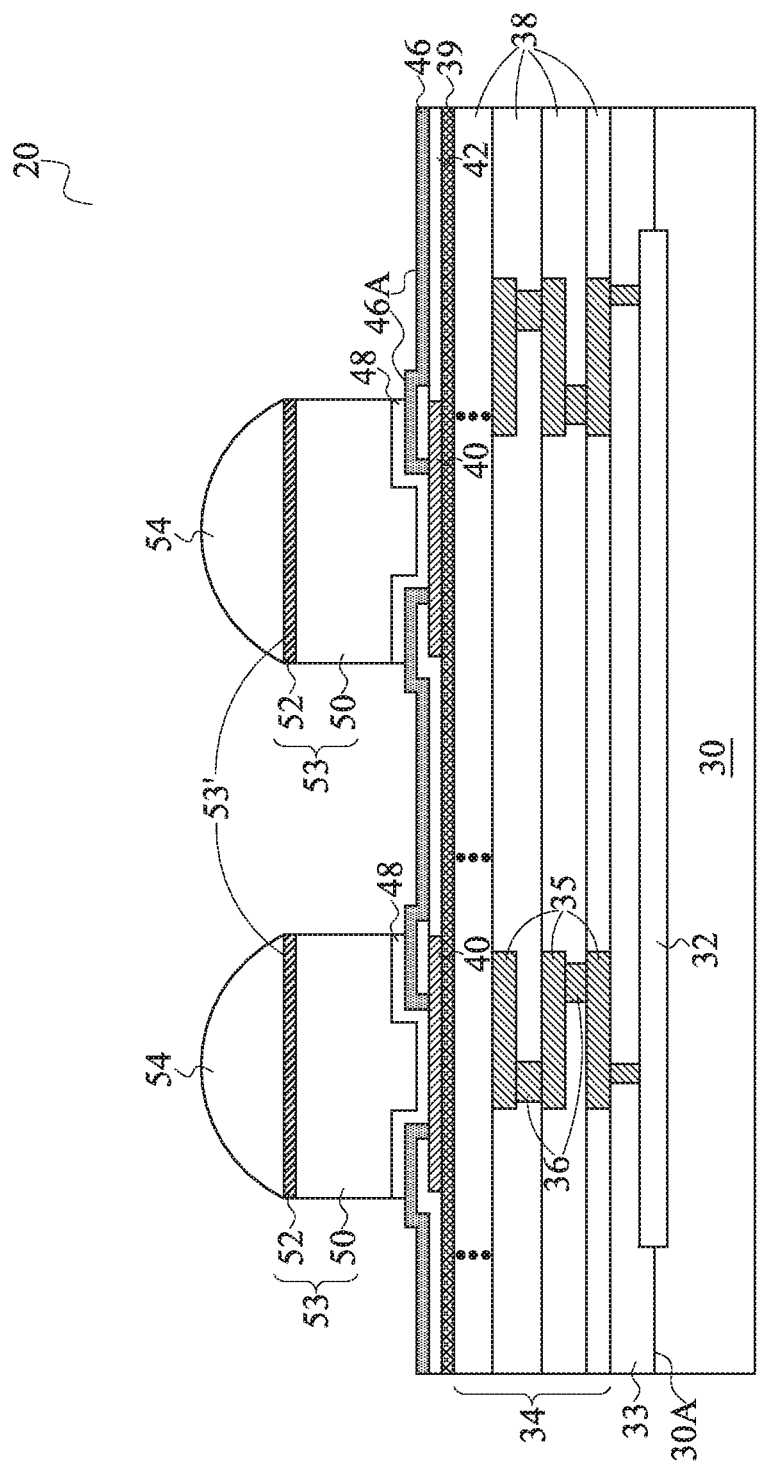
FIG. 1 illustrates a cross-sectional view of a device die including metal bumps in accordance with some exemplary embodiments.

FIG. 1 illustrates a cross-sectional view of package component 20 in accordance with exemplary embodiments. In some embodiments, package component 20 is a device die. Semiconductor substrate 30 in accordance with these embodiments may be a bulk silicon substrate or a silicon-on-insulator substrate. Alternatively, other semiconductor materials including group III, group IV, and group V elements may also be included in semiconductor substrate 30. Integrated circuit 32 is formed at surface 30A of semiconductor substrate 30. Integrated circuit 32 may include Complementary Metal-Oxide-Semiconductor (CMOS) devices therein. In alternative embodiments, package component 20 is an interposer die, a package substrate, a package, or the like. In the embodiments wherein package component 20 is an interposer die, package component 20 does not include active devices such as transistors therein. Package component 20 may include passive devices such as resistors and capacitors, or free from passive devices in these embodiments.

Package component 20 may further include Inter-Layer Dielectric (ILD) 33 over semiconductor substrate 30, and interconnect structure 34 over ILD 33. Interconnect structure 34 includes metal lines 35 and vias 36 formed in dielectric layers 38. In some embodiments, dielectric layers 38 are formed of low-k dielectric materials. The dielectric constants (k values) of the low-k dielectric materials may be less than about 23.0, or less than about 2.5, for example. Metal lines 35 and vias 36 may be formed of copper, a copper alloy, or other metals.

Metal pads 40 are formed over metal layers 34, and may be electrically coupled to circuit 32 through metal lines 35 and vias 36 in metal layers 34. Metal pads 40 may be aluminum pads or aluminum-copper pads.

Passivation layer 42 is formed to cover the edge portions of metal pads 40. The central portions of metal pads 40 are exposed through (and under) the openings in passivation layer 42. Passivation layer 42 may be a single layer or a composite layer, and may be formed of a non-porous material. In some embodiments, passivation layer 42 is a composite layer comprising a silicon oxide layer (not shown), and a silicon nitride layer (not shown) over the silicon oxide layer. In alternative embodiments, passivation layer 42 comprises Un-doped Silicate Glass (USG), silicon oxynitride, and/or the like. There may be a single passivation layer or more than one passivation layer. For example, under metal pads 40, there may be passivation layer 39. In which embodiments, passivation layer 39 and passivation layer 42 are also referred to as passivation-1 (or pass1) 39 and passivation-2 (or pass2) 42 throughout the description.

Polymer layer 46 is formed over passivation layer 42 and covers passivation layer 42. Polymer layer 46 may comprise a polymer such as an epoxy, polyimide, benzocyclobutene (BCB), polybenzoxazole (PBO), and the like. Polymer layer 46 is patterned to form openings, through which metal pads 40 are exposed.

Under-Bump Metallurgies (UBM) 48 are formed over metal pads 40. Each of UBMs 48 may have a portion over polymer layer 46, and a portion extending into the opening in polymer layer 46 to contact the respective underlying metal pad 40. In some embodiments, each of UBMs 48 includes a titanium layer and a seed layer over the titanium layer, wherein the seed layer may be formed of copper or a copper alloy.

Metal pillars 50 are formed over UBMs 48, and are co-terminus with the respective underlying UBMs 48. For example, each of the edges of metal pillars 50 is aligned to a corresponding edge of one of UBMs 48. In some exemplary embodiments, metal pillars 50 are formed of a non-solder metal or metal alloy that does not melt at normal reflow temperatures (for example, about 200° C. to about 260° C.) of solders. In some exemplary embodiments, metal pillars 50 are formed of copper or a copper alloy.

In addition to metal pillar 50, there may be additional metal layers such as metal layer 52 formed on each of metal pillars 50, wherein metal layer 52 may include a nickel layer, a palladium layer, a gold layer, or multi-layers thereof. Throughout the description, metal pillars 50 and overlying metal layers 52 (if any) are in combination referred to as metal bumps 53 hereinafter. The top surfaces 53' of metal bumps 53 are higher than top surface 46A of polymer layer 46. Solder caps 54 may also be formed on metal bumps 53, wherein solder caps 54 may be formed of a Sn—Ag alloy, a Sn—Cu alloy, a Sn—Ag—Cu alloy, or the like, and may be lead-free or lead-containing.

Figure 2:
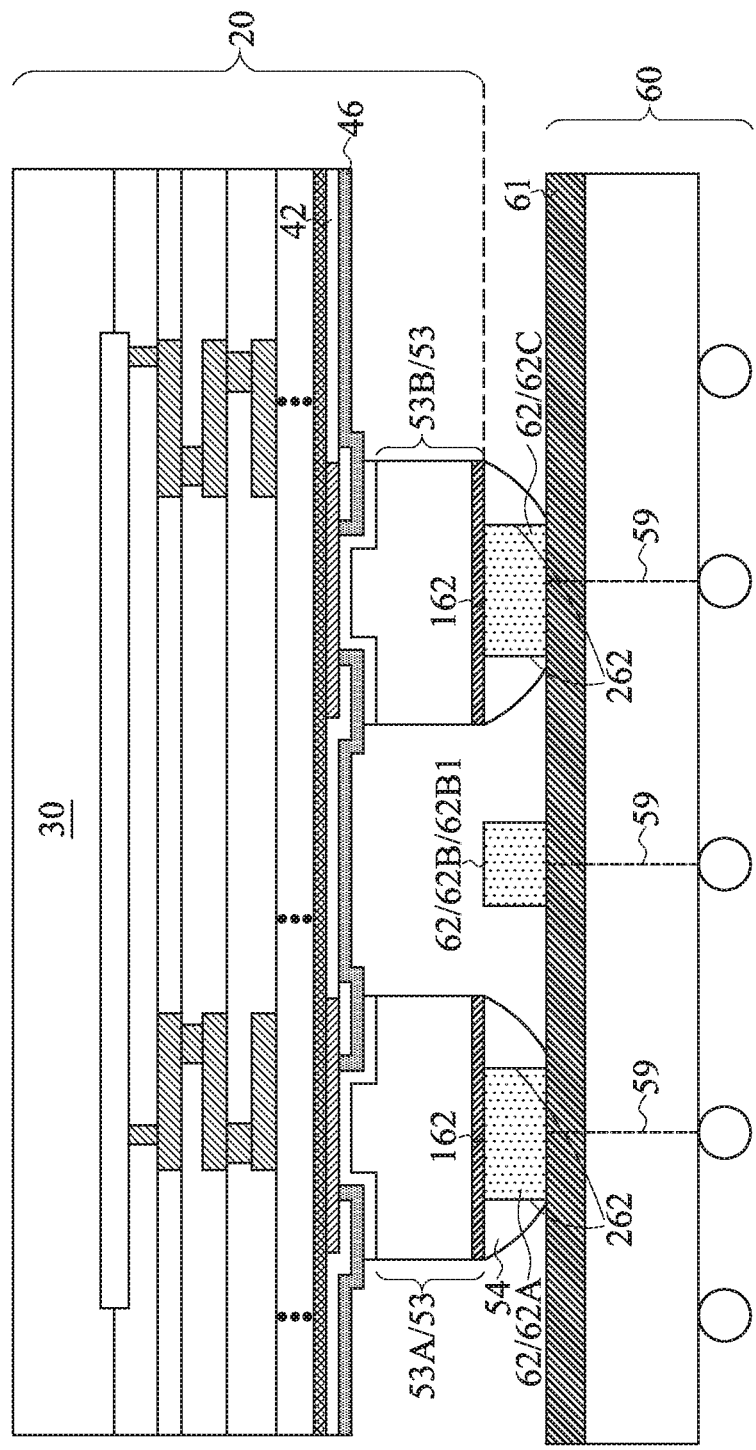
FIG. 2 illustrates a cross-sectional view of a device die bonded to a package substrate through Bump-on-Trace (BOT) bonding in accordance with some exemplary embodiments.

FIG. 2 illustrates the bonding of metal bumps 53 to metal traces 62 of package component 60 through a Bump-On-Trace (BOT) bonding scheme. In some embodiments, package component 60 is a package substrate, which may be a laminate substrate, a built-up package substrate, or the like. Package component 60 may include a plurality of dielectric layers, and metal lines and vias (represented by lines 59) embedded in the laminated dielectric layers. In alternative embodiments, package component 60 is a device die, a package, an interposer die, or the like. In the BOT bonding scheme, conductive connections 54, which may be solder regions, are bonded to the top surfaces 162 and sidewalls 262 of metal trace 62. Metal traces 62 are disposed over dielectric layer 61. Metal trace 62 may be adhered to dielectric layer 61 through Van Der Waals force. In some embodiments, as shown in FIG. 2, metal traces 62 are the topmost features of package component 60, with no dielectric layer covering metal traces 62. In alternative embodiments, there is a dielectric layer (not shown) covering most parts of metal traces 62 except those portions that are to be bonded to other components such as device die 20. The dielectric layer, if exist, may be a solder mask.

Figure 3:
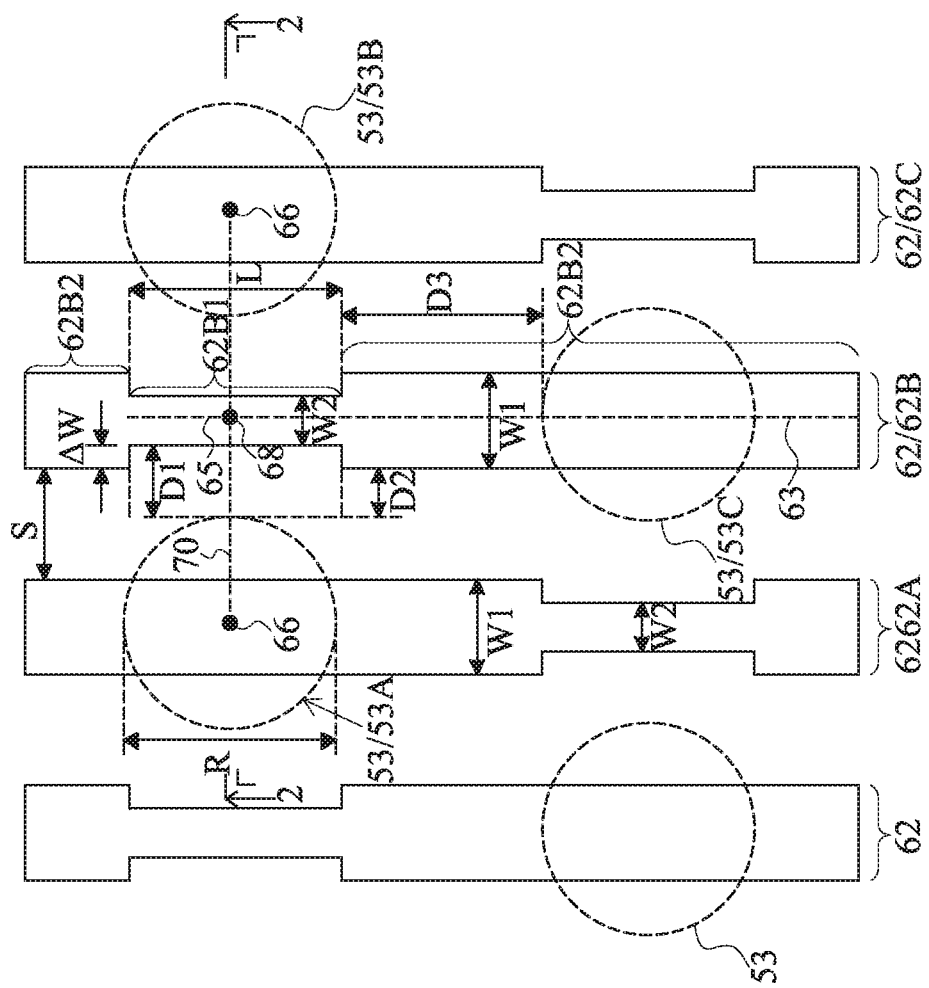
FIG. 3 illustrates a top view of metal bumps and metal traces in accordance with some exemplary embodiments, wherein a center line of a narrow metal trace portion of a metal trace is aligned to a center line of wider portions of the metal trace.

FIG. 3 illustrates an exemplary top view of metal bumps 53. The cross-sectional view shown in FIG. 2 is obtained from the plane containing line 2-2 in FIG. 3. Metal traces 62 of package component 60 (FIG. 2) are also illustrated. In some embodiments, metal bumps 53 have round top-view shapes, as illustrated in FIG. 3. In alternative embodiments, metal bumps 53 have elongated top-view shapes, and have lengthwise directions parallel to the lengthwise direction of metal traces 62. Metal bumps 53 include metal bumps 53A, 53B, and 53C. Metal traces 62 include 62A, 62B, and 62C that are parallel to each other, wherein metal bump 53A is bonded to metal trace 62A through BOT bonding, and metal bump 53B is bonded to metal trace 62C through BOT bonding. In subsequent description, metal trace 62B is discussed in detail. The discussion also applies to other metal traces including 62A and 62C.

Metal traces 62 include wide metal trace portions and narrow metal trace portions, wherein the wide metal trace portions have width W1, and the narrow metal trace portions have width W2. A significant portion (for example, more than about 40 percent, or more than about 95 percent) of metal traces 62 have width W1, except the portions of metal traces 62 that are neighboring metal bumps 53 have width W2. For example, metal trace 62B include portion 62B1 having width W2. Portions 62B2 that are connected to the opposite ends of portion 62B1 have width W1. In some exemplary embodiments, all portions of metal traces 62 that are not neighboring metal bumps 53 have width W1. Throughout the description, when a metal trace portion is referred to as being "neighboring" a metal bump, there are no other metal bumps or metal traces separate the metal trace portion and the metal bump from each other. In some embodiments, metal bumps 53 are bonded to wide metal trace portions 62B2, but not to narrow metal trace portions 62B1.

In some exemplary embodiments, width W1 is in a range between about 25 μm and about 15 μm, and width W2 is in a range between about 10 μm and about 20 μm. Width difference (W1−W2) may be equal to or greater than about ¼ of width W1. Spacing S between neighboring metal traces 62 may be in a range between about 15 μm and about 30 μm. It is appreciated, however, that the values recited throughout the description are examples, and may be changed. In the embodiments wherein metal bumps 53A and 53B are on the opposite sides of metal trace portion 62B1, center line 65 of narrow metal trace portion 62B1 may overlap center line 63 of wide metal trace portion 62B2, as shown in FIG. 3.

The neighboring metal bump 53 and narrow metal trace portion 62B1 are aligned to each other in the direction perpendicular to the lengthwise direction of narrow metal trace portion 62B1. For example, if a line (such as line 70) is drawn starting from center 68 of the narrow metal trace portion 62B1, wherein line 70 is perpendicular to center line 65 of the respective metal trace portion 62B1, then line 70 will intercept its neighboring metal bump 53. In the top view of the structure in FIG. 3, metal bump 53A has center 66. In some embodiments, line 70 overlaps center 66 of metal bump 53A.

Metal bumps 53 have top-view length R, which is the length measured in the lengthwise direction of metal traces 62. The neighboring metal trace portion 62B1 has length L, which is also measured in the lengthwise direction of metal traces 62. In some embodiments, length R is equal to or substantially equal to length L, for example, with the difference between length R and L being smaller than 10 percent of both R and L. In alternative embodiments, length L may be slightly greater than R, for example, with ratio L/R between 110 percent and about 120 percent.

Narrow metal trace portion 62B1 has no metal bumps bonded thereon. Furthermore, if there is a metal bump 53C that is bonded to metal trace 62B, the distance D3 between metal bump 53C and narrow metal trace portion 62B1 is greater than about 20 μm in accordance with some embodiments. Hence, the opposite ends of narrow metal trace portion 62B1 are connected to some wide metal trace portion 62B2, so that the wide portions 62B2 may provide mechanical support to narrow metal trace portion 62B1.

With narrow metal trace portion 62B1 being aligned to the neighboring metal bump 53, bump-to-trace distance D1, which is the distance of metal bumps to their respective neighboring metal traces 62, is increased. FIG. 3 illustrates that if the entireties of metal traces 62 have the same width W1, the bump-to-trace distance would have been equal to distance D2, which is smaller than distance D1 by a difference equal to ΔW. Hence, in the embodiments of the present disclosure, the bump-to-trace distance is increased without reducing the width W1 of the entire metal traces 62. As a result of the increase in the bump-to-trace distance, the likelihood of the bridging of solder regions 54 (FIG. 2) to the neighboring metal trace portion 62B2 is reduced. On the other hand, the length of metal trace portion 62B1 is small compared to the lengths of portions 62B2, the likelihood of the peeling of metal trace portion 62B1 is not noticeably increased.

Sample wafers are formed to test the reliability of BOT structures formed in accordance with the embodiments of the present disclosure. The structures shown in FIGS. 2 and 3 are formed on the sample wafers. The test results obtained from the sample wafers indicated that when ΔW (FIG. 3) is equal to or smaller than about 12.5% percent W1, the peeling of metal traces 62 from the underlying dielectric is not noticeably increased.

In FIG. 3, metal bumps 53 are formed on the opposite sides of metal trace portion 62B1. Center line 65 of metal trace portion 62B1 may thus overlap center line 63 of metal trace portion 62B2. FIG. 4 illustrates the top view of metal bumps 53 and metal traces 62 in accordance with alternative embodiments. In these embodiments, on one side of narrow metal trace portion 62B1, there is a neighboring metal bump 53A. On the other side of metal trace portion 62B1, however, there is no neighboring metal bump. Hence, center line 65 of metal trace portion 62B1 is offset from center line 63 of metal trace portion 62B2. By using this design, the bump-to-trace distance D3 is further increased.

FIGS. 5A through 5D illustrate the top views of various metal trace portions 62B1 and their respective connecting portions 62B2. The neighboring metal bumps that are bonded to neighboring metal traces are not shown. Referring to FIG. 5A, metal trace portion 62B1 is abruptly connected to metal trace portions 62B2, with no transition regions therebetween. FIGS. 5B, 5C, and 5D illustrate that transition regions 62B3 are formed to connect narrow metal trace portion 62B1 to wide metal trace portions 62B2. The width of transition regions 62B3 gradually increases from the regions close to narrow metal trace portion 62B1 to wide metal trace portion 62B2. In FIG. 5B, the edges of transition regions 62B3 form arcs whose centers 72 are inside metal traces 62. In FIG. 5C, the edges of transition regions 62B3 form arcs whose centers 72 are outside metal traces 62. In FIG. 5D, the edges of transition regions 62B3 are straight lines in the top view of the respective metal trace. It is appreciated that the transition region may have many other designs, which are also in the scope of the present disclosure.

The embodiments of the present disclosure have some advantageous features. In the BOT structure, by narrowing portions of the metal traces that are neighboring metal bumps, while keeping the widths of the rest portions of the metal traces not narrowed, the risk of the bridging of solder regions to neighboring metal traces is reduced. The risk of the peeling of metal traces from the underlying dielectric layer, however, is not noticeably increased.

In accordance with some embodiments, a package includes a first package component and a second package component. The first package component includes a first metal trace at a surface of the first package component, and a second metal trace at the surface of the first package component. The second metal trace is parallel to the first metal trace. The second metal trace includes a narrow metal trace portion having a first width, and a wide metal trace portion having a second width greater than the first width connected to the narrow metal trace portion. The second package component is over the first package component. The second package component includes a metal bump overlapping a portion of the first metal trace, and a conductive connection bonding the metal bump to the first metal trace. The conductive connection contacts a top surface and sidewalls of the first metal trace. The metal bump is neighboring the narrow metal trace portion.

In accordance with other embodiments, a package includes a package substrate, which includes a dielectric layer, and a first and a second metal trace over and contacting a surface of the dielectric layer. The second metal trace is parallel to the first metal trace. The second metal trace includes a narrow metal trace portion having a first width, wherein the narrow metal trace portion has a first center in a top view of the package, and a wide metal trace portion having a second width greater than the first width, wherein the wide metal trace portion is connected to the narrow metal trace portion. A device die is overlying the package substrate, wherein the device die includes a metal bump overlapping a portion of the first metal trace. The metal bump has a second center in the top view of the package. A connecting line of the first center and the second center is substantially perpendicular to a lengthwise direction of the second metal trace. A conductive connection bonds the metal bump to the first metal trace, wherein the conductive connection contacts a top surface and sidewalls of a bonding portion of the first metal trace.

In accordance with yet other embodiments, a package includes a first package component, which includes a dielectric layer, a first metal trace over and contacting the dielectric layer. The first metal trace includes a narrow metal trace portion having a first width, and a wide metal trace portion having a second width greater than the first width. The wide metal trace portion is connected to the narrow metal trace portion. A second metal trace and a third metal trace are overlying and contacting the dielectric layer. The second metal trace and the third metal trace are parallel to, and are on opposite sides of, the first metal trace. A second package component is overlying the first package component, wherein the second package component includes a first metal bump overlapping a portion of the first metal trace, and a second metal bump overlapping a portion of the third metal trace. In a top view of the package, a connecting line connecting a center of the first metal bump to a center of the second metal bump substantially overlaps a center of the narrow metal trace portion of the first metal trace. A first conductive connection bonds the first metal bump to the first metal trace. A second conductive connection bonds the second metal bump to the third metal trace.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A package comprising:
   a first package component comprising:
      a first metal trace at a surface of the first package component, the first metal trace comprising:
         a middle portion; and
         two end portions physically joined to the middle portion and on opposite sides of the middle portion, wherein each of the middle portion and the two end portions comprises a first edge and a second edge parallel to the first edge; and
      a second metal trace at the surface of the first package component, wherein the second metal trace is parallel to the first metal trace, and the second metal trace comprises:
         a narrow metal trace portion having a first width; and
         a first wide metal trace portion having a second width greater than the first width, wherein the first wide metal trace portion is connected to the narrow metal trace portion, and the middle portion and the two end portions have the second width; and
   a first solder region contacting an entirety of the middle portion of the first metal trace, with the two end portions on opposite sides of the first solder region being exposed.

2. The package of claim 1, wherein there is no solder region in physical contact with the narrow metal trace portion of the second metal trace, and wherein the first solder region contacts a top surface and two sidewalls of the middle portion of the first metal trace.

3. The package of claim 1, wherein in a top view of the package, a center of the middle portion and centers of the two end portions are aligned to a first straight line, wherein a center of the narrow metal trace portion and a center of the first wide metal trace portion are aligned to a second straight line parallel to the first straight line, and a third straight line extending from a center of the first solder region and perpendicular to the first straight line and the second straight line passes through the narrow metal trace portion.

4. The package of claim 3, wherein the third straight line substantially passes through a center of the narrow metal trace portion.

5. The package of claim 1 further comprising a second package component over the first package component, wherein the second package component comprises a metal bump overlapping and bonding to the first solder region.

6. The package of claim 3, wherein a center line of the narrow metal trace portion substantially offsets from a center line of the first wide metal trace portion, and wherein both the center line of the narrow metal trace portion and the center line of the first wide metal trace portion are parallel to the first straight line and the second straight line.

7. The package of claim 1, wherein the second metal trace further comprises a second wide metal trace portion having the second width, wherein the first wide metal trace portion and the second wide metal trace portion are connected to opposite ends of the narrow metal trace portion.

8. The package of claim 1, wherein a difference between the first width and the second width is greater than about one fourth of the second width.

9. The package of claim 1 further comprising:
   a third metal trace at the surface of the first package component, wherein the first metal trace and the third metal trace are parallel to each other, and are on opposite sides of the second metal trace; and
   a second solder region bonded to the third metal trace, wherein the first solder region, the second solder region, and the narrow metal trace portion are aligned to a straight line that is perpendicular to a lengthwise direction of the second metal trace.

10. A package comprising:
    a first package component comprising:
       a first metal trace at a surface of the first package component, the first metal trace comprising:
          a middle portion; and
          two end portions physically joined to the middle portion and on opposite sides of the middle portion; and
       a second metal trace and a third metal trace at the surface of the first package component, wherein the second metal trace and the third metal trace are parallel to, and are on opposite sides of, the first metal trace, with each of the second metal trace and the third metal trace spaced apart from the first metal trace by a distance, and the distance is measured in a widthwise direction perpendicular to a lengthwise direction of the first metal trace, and each of the second metal trace and the third metal trace comprises:
          a narrow metal trace portion having a first width; and
          a first and a second wide metal trace portion, wherein the first and the second wide metal trace portions are connected to opposite ends of the narrow metal trace portion, and the middle portion and the two end portions have second widths greater than the first width; and
       a solder region contacting the middle portion of the first metal trace, with the two end portions on opposite sides of the solder region being exposed, wherein there is no solder region in physical contact with the narrow metal trace portions of the second metal trace and the third metal trace.

11. The package of claim 10, wherein the middle portion and the two end portions have the second widths that are equal to each other, and the first width and the second widths are measured in the widthwise direction.

12. The package of claim 10, wherein in a top view of the package, a straight line connecting a first center of the narrow metal trace portion of the second metal trace to a second center of the narrow metal trace portion of the third metal trace passes through the solder region.

13. The package of claim 12, wherein the straight line substantially passes through a center of the solder region.

14. The package of claim 10, wherein in a top view of the package, a length of the solder region measured in the lengthwise direction of the first metal trace is not longer than lengths of the narrow metal trace portion of the second metal trace and the narrow metal trace portion of the third metal trace.

15. The package of claim 10, wherein the solder region extends beyond edges of the middle portion of the first metal trace in the widthwise direction.

16. A package comprising:
   a first package component comprising:
      a dielectric layer;
      a first metal trace over and contacting the dielectric layer, wherein the first metal trace comprises:
         a narrow metal trace portion having a first width, wherein there is no solder region in physical contact with the narrow metal trace portion of the first metal trace; and
         a first and a second wide metal trace portion having a second width greater than the first width, wherein the first wide metal trace portion and the second wide metal trace portion are connected to opposite ends of the narrow metal trace portion;
      a second metal trace and a third metal trace over and contacting the dielectric layer, wherein the second metal trace and the third metal trace are parallel to, and are on opposite sides of, the first metal trace;
      a first solder region in physical contact with the second metal trace; and
      a second solder region in physical contact with the third metal trace, wherein in a top view of the package, a connecting line connecting a center of the first solder region to a center of the second solder region passes through the narrow metal trace portion of the first metal trace.

17. The package of claim 16 further comprising a second package component over the first package component, wherein the second package component comprises:
   a first metal bump overlapping and bonded to the first solder region; and
   a second metal bump overlapping and bonded to the second solder region.

18. The package of claim 16, wherein the first solder region is in physical contact with a top surface and sidewalls of the second metal trace, and the second solder region is in physical contact with a top surface and sidewalls of the third metal trace.

19. The package of claim 16, wherein the first package component has no dielectric layer disposed over and contacting top surfaces of the first metal trace, the second metal trace, and the third metal trace.

20. The package of claim 16, wherein no solder is bonded to the first wide metal trace portion and the second wide metal trace portion of the first metal trace.

* * * * *